(12) United States Patent
Park et al.

(10) Patent No.: US 7,670,903 B2
(45) Date of Patent: Mar. 2, 2010

(54) METHOD FOR FABRICATING A CYLINDRICAL CAPACITOR USING AMORPHOUS CARBON-BASED LAYER

(75) Inventors: Ki-Seon Park, Ichon-shi (KR);
  Jae-Sung Roh, Ichon-shi (KR);
  Deok-Sin Kil, Ichon-shi (KR);
  Han-Sang Song, Ichon-shi (KR);
  Seung-Jin Yeom, Ichon-shi (KR);
  Jin-Hyock Kim, Ichon-shi (KR);
  Kee-Jeung Lee, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 299 days.

(21) Appl. No.: 11/646,481

(22) Filed: Dec. 28, 2006

(65) Prior Publication Data
  US 2008/0003741 A1  Jan. 3, 2008

(30) Foreign Application Priority Data
  Jun. 29, 2006  (KR) .............. 10-2006-0059251

(51) Int. Cl.
  *H01L 21/8242* (2006.01)
(52) U.S. Cl. ............ 438/253; 438/254; 438/396; 257/E21.648
(58) Field of Classification Search ........... 438/238, 438/253–256, 396–399, 381; 257/E21.648
  See application file for complete search history.

(56) References Cited

U.S. PATENT DOCUMENTS

| 2002/0079526 | A1  | 6/2002  | Fukuda et al. |
| 2003/0008469 | A1* | 1/2003  | Hwang et al. ............. 438/396 |
| 2004/0214354 | A1* | 10/2004 | Marsh et al. ............... 438/3 |
| 2005/0186802 | A1* | 8/2005  | Busch et al. .............. 438/736 |
| 2005/0208729 | A1* | 9/2005  | Fishburn et al. ........... 438/424 |
| 2006/0063324 | A1* | 3/2006  | Park et al. ................ 438/239 |

(Continued)

FOREIGN PATENT DOCUMENTS

JP    2005-229097    8/2005

(Continued)

OTHER PUBLICATIONS

English translation of the first office action issued from the State Intellectual Property Office of the People's Republic of China on Sep. 12, 2008, in counterpart Chinese patent application No. 200710087202.4.

(Continued)

*Primary Examiner*—H. Jey Tsai
(74) *Attorney, Agent, or Firm*—IP & T Law Firm PLC

(57) ABSTRACT

A method for fabricating a cylindrical capacitor. The method includes forming an isolation structure including an interlayer on a substrate, the substrate having a plurality of contact plugs formed therein, forming a plurality of opening regions by etching the isolation structure, thereby exposing selected portions of the contact plugs, forming storage nodes on a surface of the opening regions, etching selected portions of the isolation structure to form a patterned interlayer that encompasses selected portions of the storage nodes, thereby supporting the storage nodes, removing remaining portions of the isolation structure, and removing the patterned interlayer to expose inner and outer walls of the storage nodes.

36 Claims, 14 Drawing Sheets

U.S. PATENT DOCUMENTS

| | | |
|---|---|---|
| 2006/0099768 A1* | 5/2006 | Yokoi .................... 438/381 |
| 2006/0134854 A1 | 6/2006 | Park et al. |
| 2006/0189055 A1* | 8/2006 | Park et al. .................... 438/197 |
| 2006/0211178 A1* | 9/2006 | Kim et al. .................... 438/129 |

FOREIGN PATENT DOCUMENTS

| | | |
|---|---|---|
| KR | 10-2005-0045608 | 5/2005 |
| KR | 10-2005-0083426 | 8/2005 |
| KR | 10-2006-0068199 | 6/2006 |
| KR | 10-2006-0074972 | 7/2006 |

OTHER PUBLICATIONS

Notice of Preliminary Rejection issued from the Taiwanese Patent Office on Dec. 8, 2009.

* cited by examiner

METHOD FOR FABRICATING A CYLINDRICAL CAPACITOR USING AMORPHOUS CARBON-BASED LAYER

RELATED APPLICATIONS

The present invention claims priority of Korean patent application number 10-2006-0059251, filed on Jun. 29, 2006 which is incorporated by reference in its entirety.

BACKGROUND

The present invention relates to a method for fabricating a semiconductor device, and more particularly, to a method for fabricating a cylindrical capacitor.

In dynamic random access memories (DRAMs), the design rule has been shifted to miniaturization. Accordingly, the size of cells has also been scaled down. As a result, the height of cylindrical capacitors has increased. In order to obtain a sufficient level of capacitance, the thickness of dielectric layers of capacitors has to be decreased. This development trend is due to the fact that the capacitance of a capacitor is directly proportional to the area of electrodes and the dielectric constant of a dielectric layer of the capacitor, and inversely proportional to the distance between the electrodes (i.e., the thickness of the dielectric layer).

However, the increase in height of cylindrical capacitors induces difficulties in applying subsequent processes, and comprises many limitations. Thus, researchers are actively studying for various methods to decrease the thickness of the dielectric layer. In addition, researchers are also focusing on developing new electrode materials, for instance, a metal-based material, to replace polysilicon. When polysilicon is used as an electrode material, the decrease of the thickness of the dielectric layer may be limited due to the presence of an oxide layer formed on the electrode.

If a metal-based material is used as an electrode material, a crystal development, which is one characteristic of metals, appears. For instance, in the case of titanium nitride (TiN), crystals are grown to a columnar structure. Due to this crystal structure, the surface of TiN generally becomes rough, and a wet etch solution is likely to penetrate into a TiN-based electrode through interfaces between crystallines or a defective layer. Thus, when an oxide layer for molding a capacitor is removed by wet etching to form a cylindrical TiN-based bottom electrode, a bottom structure underneath the TiN-based bottom electrode is often damaged by the wet etch solution. As a result, operational malfunction or dysfunction in DRAMs may occur. Furthermore, the miniaturization is likely to cause formation of bridges between bottom electrodes during a dip-out treatment, which is one type of wet etching for removing an oxide layer.

FIG. 1A illustrates a sectional view of a conventional capacitor structure prior to a dip-out treatment. This sectional view is obtained when the capacitor structure is cut in X-X' and Y-Y' directions as illustrated in FIG. 1B. Particularly, stack structures, each including a storage node contact plug 13 and a barrier metal layer 14, both passing through a storage node contact oxide layer 12, are formed on a substrate 11. An etch stop layer 15 and a capacitor molding oxide layer 16 are formed on storage node contact oxide layer 12.

Capacitor molding oxide layer 16 and etch stop layer 15 are etched to form openings, and cylindrical storage nodes 17 are formed inside the openings. Capacitor molding oxide layer 16 is removed by a wet dip-out treatment to expose the inner and outer walls of storage nodes 17, so as to form a cylinder structure.

However, the miniaturization often causes cylindrical storage nodes 17 to be spaced closer to each other. Thus, even though the wet dip-out treatment is optimized, bridges are likely to form between cylindrical storage nodes 17.

FIG. 1B illustrates an image of conventional storage nodes 17 obtained after the wet dip-out treatment. Particularly, storage nodes 17 illustrated in FIG. 1B are likely to be bridged together due to decreased spacing distances between storage nodes 17. The spacing distances between storage nodes 17 in X-X' direction is narrower than that in Y-Y' direction. As a result, when the wet dip-out treatment is carried out, storage nodes 17 may not be supported firmly, resulting in collapsed and further bridged storage nodes 17.

SUMMARY

Consistent with the present invention, there is provided a method for fabricating a capacitor of a semiconductor device, which may reduce a bridge formation between storage nodes in a wet dip-out treatment even if the height of the storage nodes increases.

Consistent with the present invention, there is provided a method for fabricating a cylindrical capacitor. The method includes forming an isolation structure including an interlayer on a substrate, the substrate having a plurality of contact plugs formed therein; forming a plurality of opening regions by etching the isolation structure, thereby exposing selected portions of the contact plugs; forming storage nodes on a surface of the opening regions; etching selected portions of the isolation structure to form a patterned interlayer that encompasses selected portions of the storage nodes, thereby supporting the storage nodes; removing remaining portions of the isolation structure; and removing the patterned interlayer to expose inner and outer walls of the storage nodes.

In accordance with another aspect of the present invention, there is provided a method for fabricating a cylindrical capacitor. The method includes forming an isolation structure over a substrate, the substrate having contact plugs formed therein, the isolation structure including an interlayer as a supporting layer; etching the isolation structure to form opening regions exposing the contact plugs; forming cylindrical storage nodes in the opening regions; removing a portion of the isolation structure to expose selected portions of the storage nodes; etching the remaining isolation structure up to the supporting layer to form a ring-patterned supporting layer, the ring-patterned supporting layer encompassing outer walls of the storage nodes and being connected between the neighboring storage nodes; performing a wet dip-out treatment to remove the isolation structure except for the ring-patterned supporting layer; and removing the ring-patterned supporting layer to expose the outer and inner walls of the storage nodes.

DETAILED DESCRIPTION

FIGS. 2A to 2I are sectional views illustrating a method for fabricating a capacitor having a cylinder structure consistent with an embodiment of the present invention. Particularly, the sectional views illustrated in FIGS. 2A to 2I are obtained when the capacitor structure is cut in A-A' and B-B' directions as illustrated in FIGS. 3A to 3E.

Figure 1A:
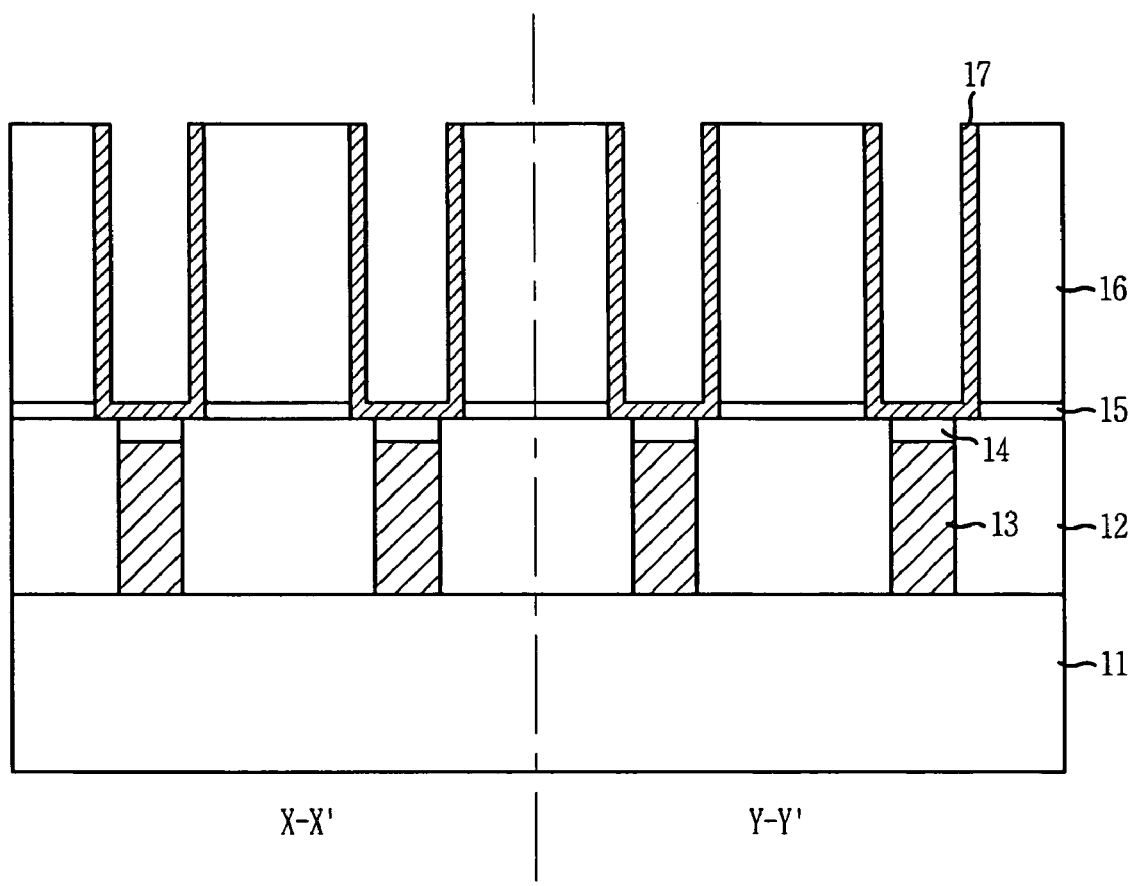
FIG. 1A illustrates a sectional view of a conventional capacitor structure prior to a wet dip-out treatment.
Figure 1B:
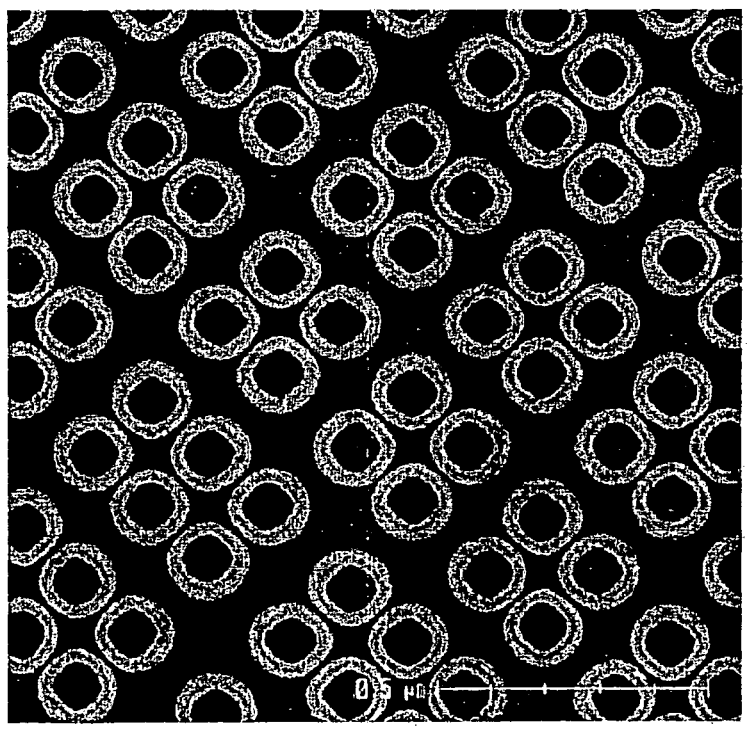
FIG. 1B illustrates an image of conventional storage nodes that may be bridged together after the wet dip-out treatment.
Figure 1B:
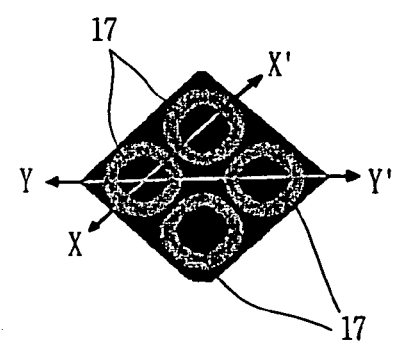
Figure 2A:
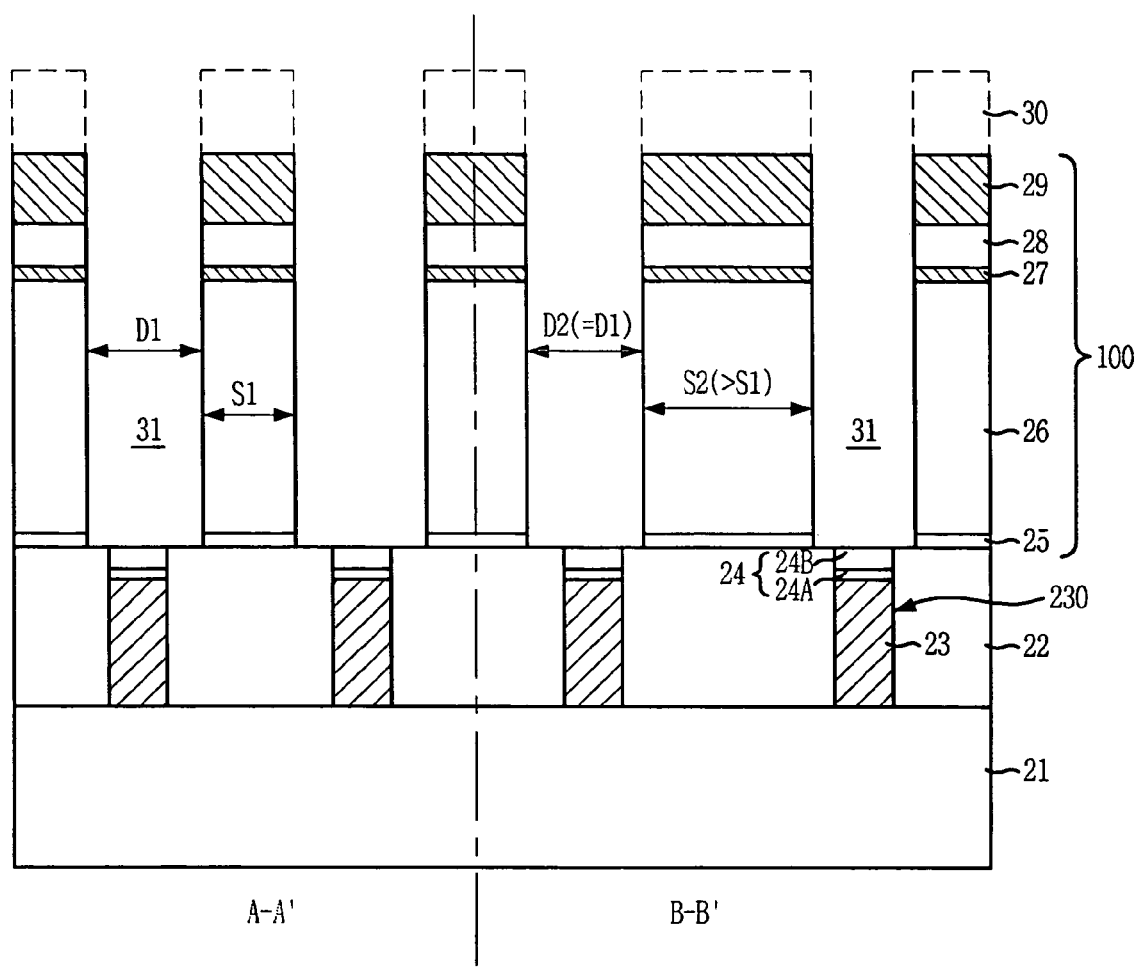
FIGS. 2A to 2I are sectional views illustrating a method for fabricating a cylindrical capacitor consistent with an embodiment of the present invention.

Referring to FIG. 2A, an insulation layer 22 may be formed on a substrate 21, insulation layer 22 being etched to form contact holes 230. Hereinafter, contact holes 230 will be interchangeably referred to as storage node contact holes 230. A plug material fills storage node contact holes 230 to form contact plugs 23 (or, storage node contact plugs 23). Hereinafter, contact plugs 23 will be interchangeably referred to as storage node contact plugs 23. Although not illustrated, prior to forming insulation layer 22, transistors including word lines and bit lines may already be formed on substrate 21. Insulation layer 22 may be made of an oxide-based material, more particularly, an undoped silicon glass (USG) material. Insulation layer 22 is approximately 1,000 Å to 3,000 Å thick.

To form storage node contact plugs 23, insulation layer 22 may be etched using a storage node contact mask to form storage node contact holes 230, and a polysilicon layer may be formed on insulation layer 22, thereby filling storage node contact holes 230. An etch-back process may be performed on the polysilicon layer to form storage node contact plugs 23.

A barrier metal structure 24 may be formed over storage node contact plugs 23. More specifically, a titanium (Ti) layer is deposited by performing a chemical vapor deposition (CVD) process followed by a rapid thermal annealing treatment. Due to the rapid thermal annealing treatment, Ti reacts with silicon (Si) of a bottom structure to form a titanium silicide (TiSi$_2$) layer 24A. Thereafter, a TiN layer 24B having a thickness of approximately 1,000 Å to 2,000 Å may be deposited on TiSi$_2$ layer 24A by performing a CVD process. TiN layer 24B may be planarized by a chemical mechanical polishing (CMP) or etch-back treatment. If a conductive layer for subsequently forming storage nodes includes TiN, the deposition and planarization of TiN layer 24 may be omitted.

A first isolation structure 100 may be formed over the insulation layer 22 where storage node contact plugs 23 are formed therein. More specifically, an etch stop layer, a capacitor molding layer, an interlayer, a buffer layer, and a hard mask layer may be formed over insulation layer 22 and etched to form a patterned etch stop layer 25, a patterned capacitor molding layer 26, a patterned interlayer 27, a patterned buffer layer 28, and a hard mask 29.

The etch stop layer may include a nitride-based material. The capacitor molding layer may include a low temperature undoped oxide-based material, such as plasma enhanced tetraethyl orthosilicate (PETEOS), phosphosilicate glass (PSG), borophosphosilicate (BPSG), and/or a combination thereof. The capacitor molding layer having a thickness of approximately 5,000 Å to 15,000 Å may be formed. The interlayer, which may include amorphous carbon, may be formed by performing a plasma enhanced chemical vapor deposition (PECVD) process at a temperature in a range of approximately 300° C. to 500° C. The interlayer having a thickness of approximately 500 Å to 2,000 Å may be formed. The buffer layer may include a low temperature undoped oxide-based material, such as PETEOS, PSG, and/or BPSG. The buffer layer may be formed to have a thickness ranging from approximately 500 Å to 2,000 Å. The hard mask layer, which may include amorphous carbon, may be formed by performing a PECVD process at a temperature ranging from approximately 300° C. to 500° C. The hard mask layer may have a thickness ranging from approximately 2,000 Å to 5,000 Å.

A photoresist layer is coated over the hard mask layer and patterned through photolithography to form a storage node mask 30. Storage node mask 30 needs to be formed in an arrayed zigzag pattern, detailed description of which will be provided later.

Although not illustrated, an anti-reflective coating (ARC) layer having a thickness of approximately 500 Å to 1,500 Å may be formed on the hard mask layer as an additional hard mask. The anti-reflective coating layer may include silicon oxynitride (SiON) or an oxide-based material. The anti-reflective coating layer and the hard mask layer may be patterned using storage node mask 30 as an etch barrier.

The buffer layer, the interlayer and the capacitor molding layer may be etched using hard mask 29 to form opening regions 31 in a circular shape. Opening regions 31 are regions where bottom electrodes are to be formed. Storage node mask 30 may be etched away during the above etching for forming opening regions 31. Thus, hard mask 29 may substantially function as an etch barrier.

The etch stop layer underneath opening regions 31 may be etched to expose storage node contact plugs 23. Because opening regions 31, where storage nodes are to be formed, may be formed as holes, opening regions 31 are often referred to as storage node holes 31. Also, opening regions 31 may be defined by first isolation structure 100 including patterned etch stop layer 25, patterned capacitor molding layer 26, patterned interlayer 27, patterned buffer layer 28, and hard mask 29, which are formed in the sequential order as mentioned above. In addition, reference numerals D1 and D2 represent diameters of opening regions 31, and reference numerals S1 and S2 represent separation distances between opening regions 31.

Figure 2B:
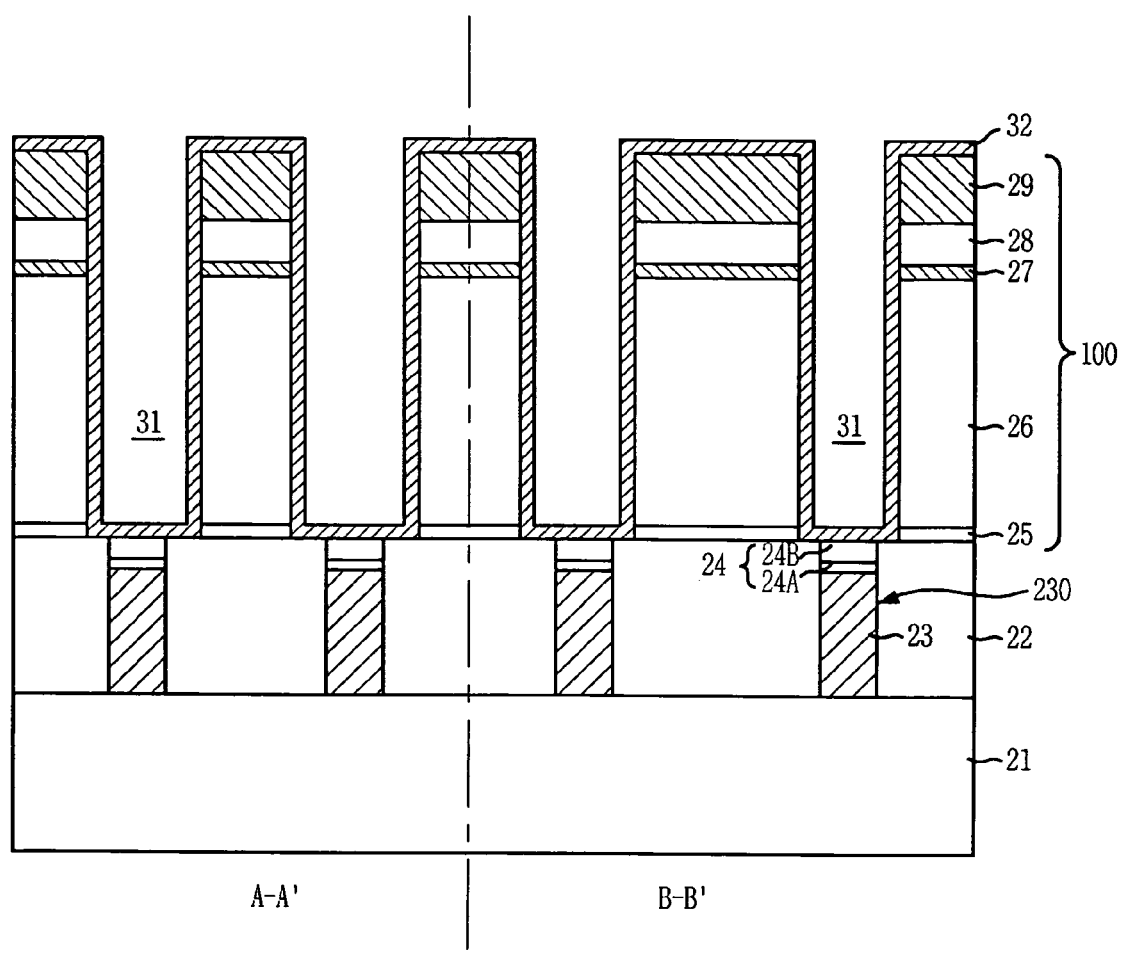

Referring to FIG. 2B, a conductive layer 32 for use in a storage node (hereinafter referred to as storage node conductive layer 32) may be formed on hard mask 29 and on the surface of openings 31. Storage node conductive layer 32 may be formed of a material including TiN or ruthenium (Ru). It is appreciated that other materials may be used for storage node conductive layer 32. More specifically, storage node conductive layer 32 may formed by performing a CVD process or an atomic layer deposition (ALD) process. Storage node conductive layer 32 may have a thickness ranging from approximately 200 Å to 400 Å.

If TiN is used for storage node conductive layer 32, the deposition and planarization of TiN layer 24B performed prior to forming the etch stop layer may be omitted. That is, if both barrier metal structure 24 and storage node conductive layer 32 include TiN, additional deposition and planarization of TiN layer 24B is unnecessary. Even if TiN layer 24B is not formed, the deposition of Ti layer by the CVD process and the rapid thermal annealing treatment still need to be performed prior to forming storage node conductive layer 32 (e.g., TiN layer) so as to form an ohmic contact between storage node conductive layer 32 and storage node contact plugs 23. This ohmic contact is to improve resistance characteristics.

In the case of using TiN for storage node conductive layer 32, a CVD process employing titanium tetrachloride (TiCl$_4$) may be used as a source material, Ammonia (NH$_3$), which is used as a reaction gas, may be applied at a temperature ranging from approximately 400° C. to 700° C. In the case of using Ru for storage node conductive layer 32, an ALD method using Ru(EtCp)$_2$ may be used as a source material. Oxygen (O$_2$) gas, which is used as a reaction gas, may be applied at a temperature ranging from approximately 200° C. to 400° C.

Figure 2C:
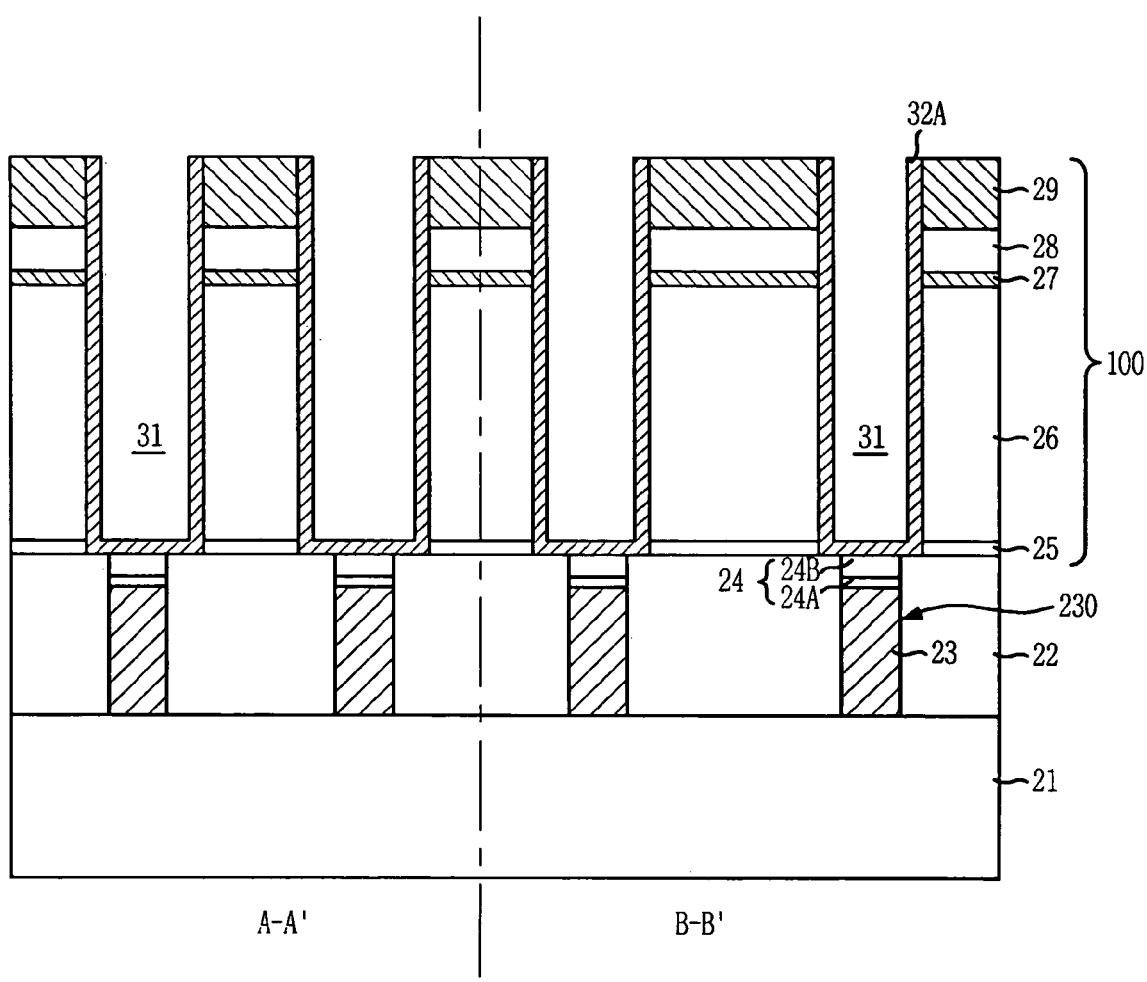

Referring to FIG. 2C, a storage node isolation process is performed. More specifically, storage node conductive layer 32 is subjected to a dry etch-back treatment without using an additional barrier. If storage node conductive layer 32 includes TiN, the storage node isolation process may proceed by employing CMP or dry etch-back with a photoresist-based barrier or an oxide-based barrier. If the photoresist-based barrier or oxide-based barrier is used, the inner side of opening regions 31 is not contaminated during the storage node isolation process.

The storage node isolation process may be continued until the surface of hard mask 29 is exposed to form storage nodes 32A inside opening regions 31. As illustrated in FIG. 2C, storage nodes 32A may have a cylinder structure. For instance, the portion of storage node conductive layer 32 (see FIG. 2B) disposed on hard mask 29 outside opening regions 31 is removed by CMP or dry etch-back to form storage nodes 32A on the bottom and sidewall portions of opening regions 31.

Figure 2D:
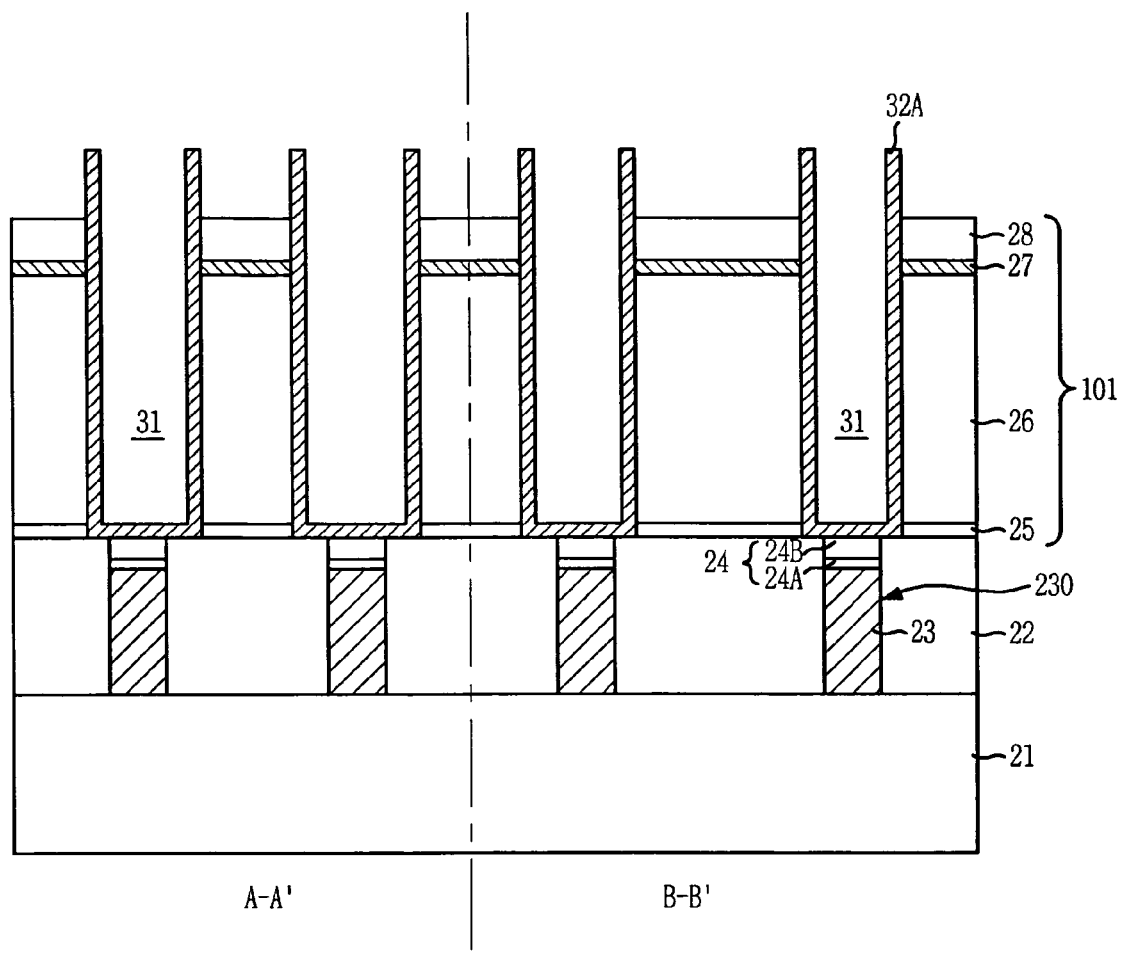

Referring to FIG. 2D, the remaining hard mask 29 may be removed by performing an O$_2$-based ashing treatment. Similar to photoresists, hard mask 29 is easily removed by O$_2$. Therefore, due to the removal of hard mask 29, upper portions of storage nodes 32A and patterned buffer layer 28 are exposed. As a result, a second isolation structure 101 including patterned etch stop layer 25, patterned capacitor molding layer 26, patterned interlayer 27, and patterned buffer layer 28 is formed.

Figure 2E:
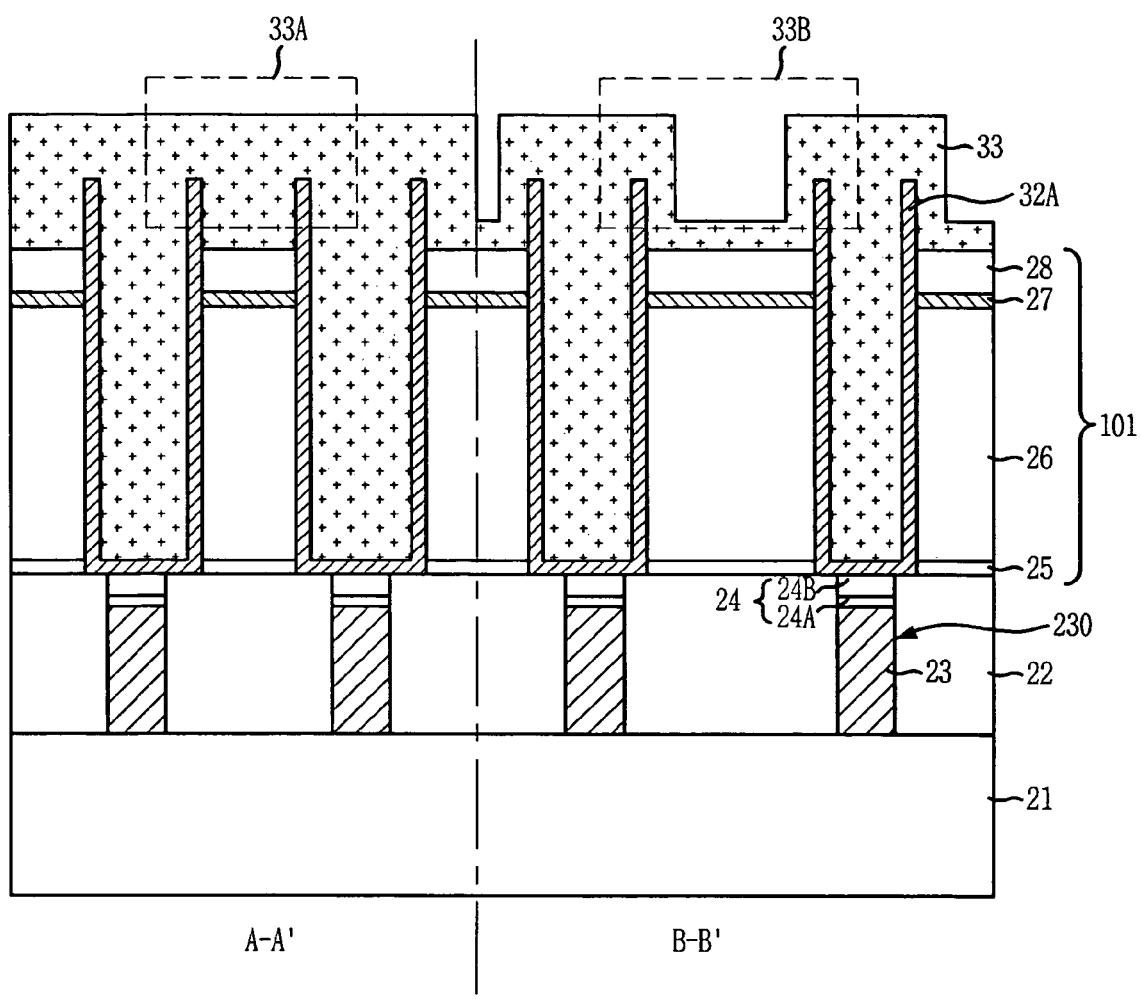

Referring to FIG. 2E, a sacrificial layer 33 is formed on second isolation structure 101 and the exposed storage nodes 32A. Sacrificial layer 33 may include an oxide-based material, such as silicon oxide (SiO$_2$), and may be formed by performing an ALD process. Hexachloro silane (Si$_2$Cl$_6$), or "HCD," is used as a source gas, and pyridine and H$_2$O vapor are used as a catalytic material and a reaction gas, respectively. Sacrificial layer 33 formed by the ALD process is deposited at a low temperature of approximately 100° C. (e.g., in a range of approximately 80° C. to 150° C.). When sacrificial layer 33 is formed through a low temperature ALD process, sacrificial layer 33 may have a good step coverage and may be easily removable through a wet dip-out treatment.

Sacrificial layer 33 is formed to a certain thickness on second isolation structure 101 and storage nodes 32A. Particularly, the thickness of sacrificial layer 33 is adjusted such that sacrificial layer 33 fills the space between neighboring storage nodes 32A that are narrowly spaced (see 33A), and does not fill the space between neighboring storage nodes 32A that are widely spaced (see 33B). The reason for sacrificial layer 33 having different thicknesses at different positions is that storage nodes 32A are spaced closer to each other in the A-A' direction, while storage nodes 32A are spaced further apart from each other in the B-B' direction. The ALD process allows adjustment of the thickness of sacrificial layer 33 at different positions.

Figure 2F:
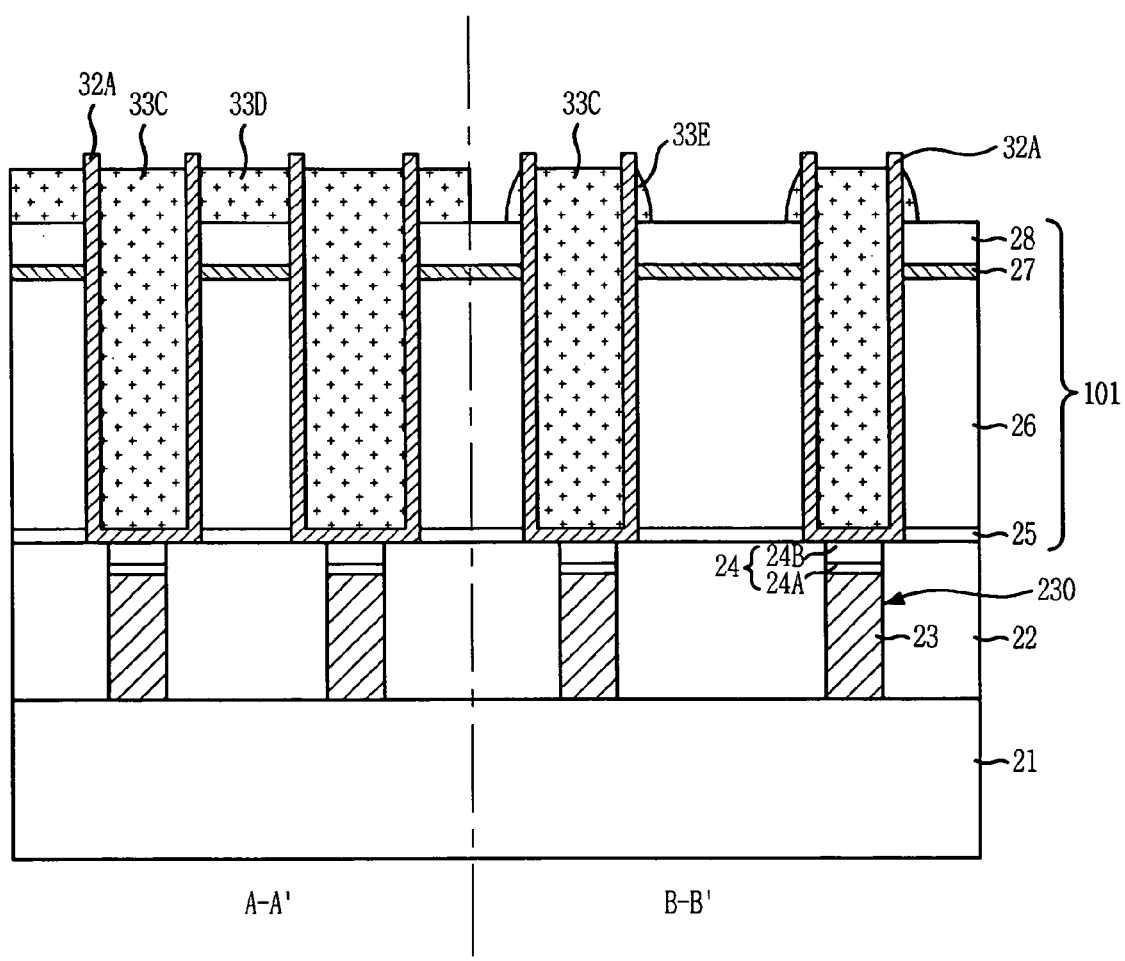

Referring to FIG. 2F, sacrificial layer 33 is subjected to a dry etch-back treatment. After the dry etch-back treatment, a first portion of sacrificial layer 33 remains inside storage nodes 32A in the A-A' and B-B' directions; a second portion of sacrificial layer 33 remains such that the second portion of sacrificial layer 33 fills the spaces between storage nodes 32A in the A-A' direction; and a third portion of sacrificial layer 33 does not fill the spaces between storage nodes 32A in B-B' direction. Reference numerals 33C, 33D, and 33E represent the first portion of sacrificial layer 33 (hereinafter referred to as first sacrificial layer 33C) remaining inside storage nodes 32A, the second portion of sacrificial layer 33 (hereinafter referred to as second sacrificial layer 33D) filling the space between storage nodes 32A, and the third portion of sacrificial layer 33 (hereinafter referred to as third sacrificial layer 33E) not filling the space between storage nodes 32A, respectively. Sacrificial layer 33 disposed between storage nodes 32A is thinner in the B-B' direction than in the A-A' direction. Thus, third sacrificial layer 33E remains as a spacer on sidewalls of the top portions of storage nodes 32A, which is exposed by the dry etch-back treatment.

Meanwhile, the dry etch-back treatment may be performed to expose the top portions of storage nodes 32A in the A-A' and B-B' directions. Thus, after the dry etch-back treatment of sacrificial layer 33, in the A-A' direction, patterned buffer layer 28 may not be exposed due to second sacrificial layer 33D remaining in the A-A' and B-B' directions, patterned. buffer layer 28 may be exposed due to third sacrificial layer 33E remaining as a spacer.

Figure 2G:
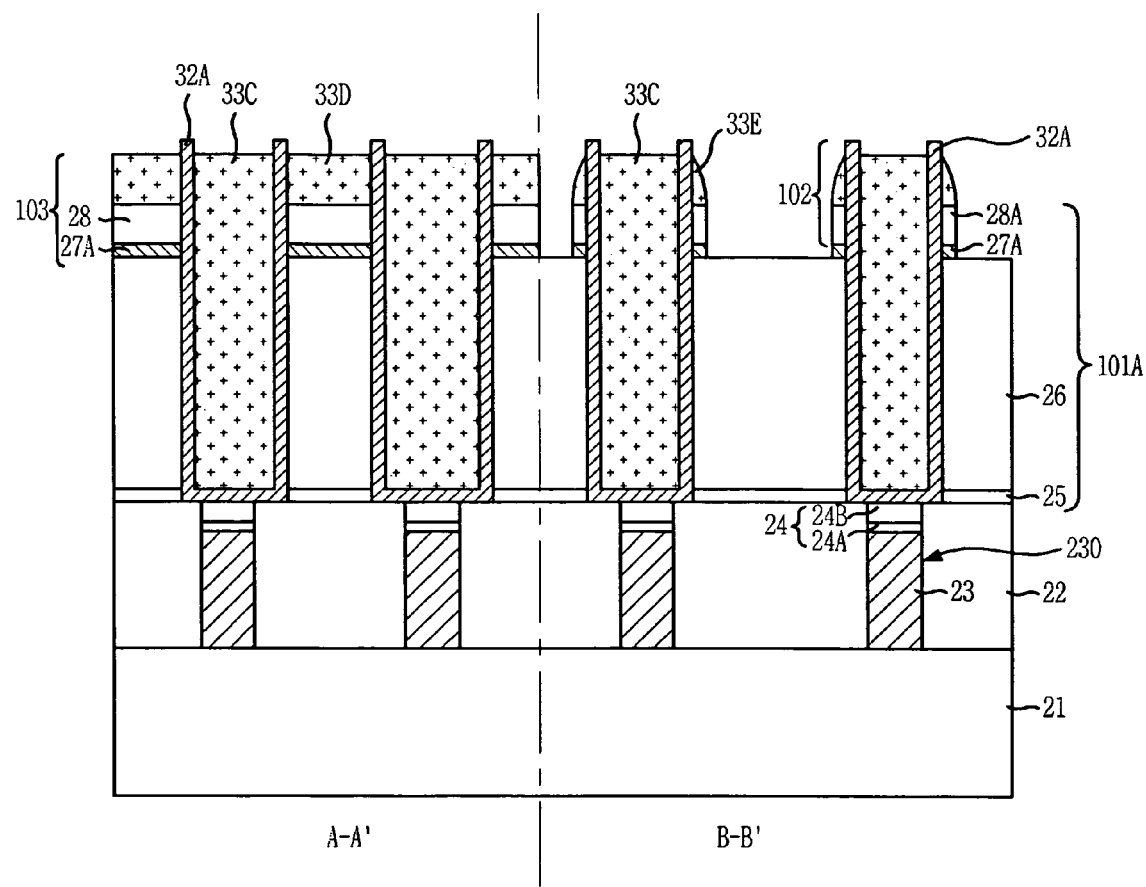

Referring to FIG. 2G, the dry etch-back treatment is continued on patterned buffer layer 28 and patterned interlayer 27 in the A-A' and B-B' directions. In particular, in the A-A' direction, because second sacrificial layer 33D covers patterned buffer layer 28, patterned buffer layer 28 may not be etched, while in the B-B' direction, patterned buffer layer 28 and patterned interlayer 27 may be etched. Reference numeral 101A denotes a third isolation structure.

More specifically, second sacrificial layer 33D in the A-A' direction functions as an etch barrier during the dry etch-back of patterned buffer layer 28 and patterned interlayer 27. Although a portion of second sacrificial layer 33D may be removed during the dry etch-back of patterned buffer layer 28 in the A-A' direction, the removal should prevent patterned buffer layer 28 from being exposed.

After the dry etch-back of patterned buffer layer 28 and patterned interlayer 27, the top portions of storage nodes 32A in the B-B' direction are supported by a first stack structure 102 including a remaining interlayer 27A, a remaining buffer layer 28A, and third sacrificial layer 33E. On the other hand, the top portions of storage nodes 32A in the A-A' direction are supported by a second stack structure 103 filling the space between storage nodes 32A. Second stack structure 103 includes remaining interlayer 27A, patterned buffer layer 28, and second sacrificial layer 33D. From a top view, remaining interlayer 27A in the B-B' direction encompasses outer walls of storage nodes 32A like a ring. Also, remaining buffer layer 28A and third sacrificial layer 33E encompass the outer walls of storage nodes 32A like a ring.

Because the dry etch-back treatment proceeds in a blanket etch type, remaining interlayer 27A remains connected in the A-A' direction, but becomes disconnected in the B-B' direction. Therefore, remaining interlayer 27A is in the form of a ring encompassing the outer walls of individual storage nodes 32A. This structure of remaining interlayer 27A is illustrated in FIGS. 3D and 3E, the detailed description of which will be provided later.

Figure 2H:
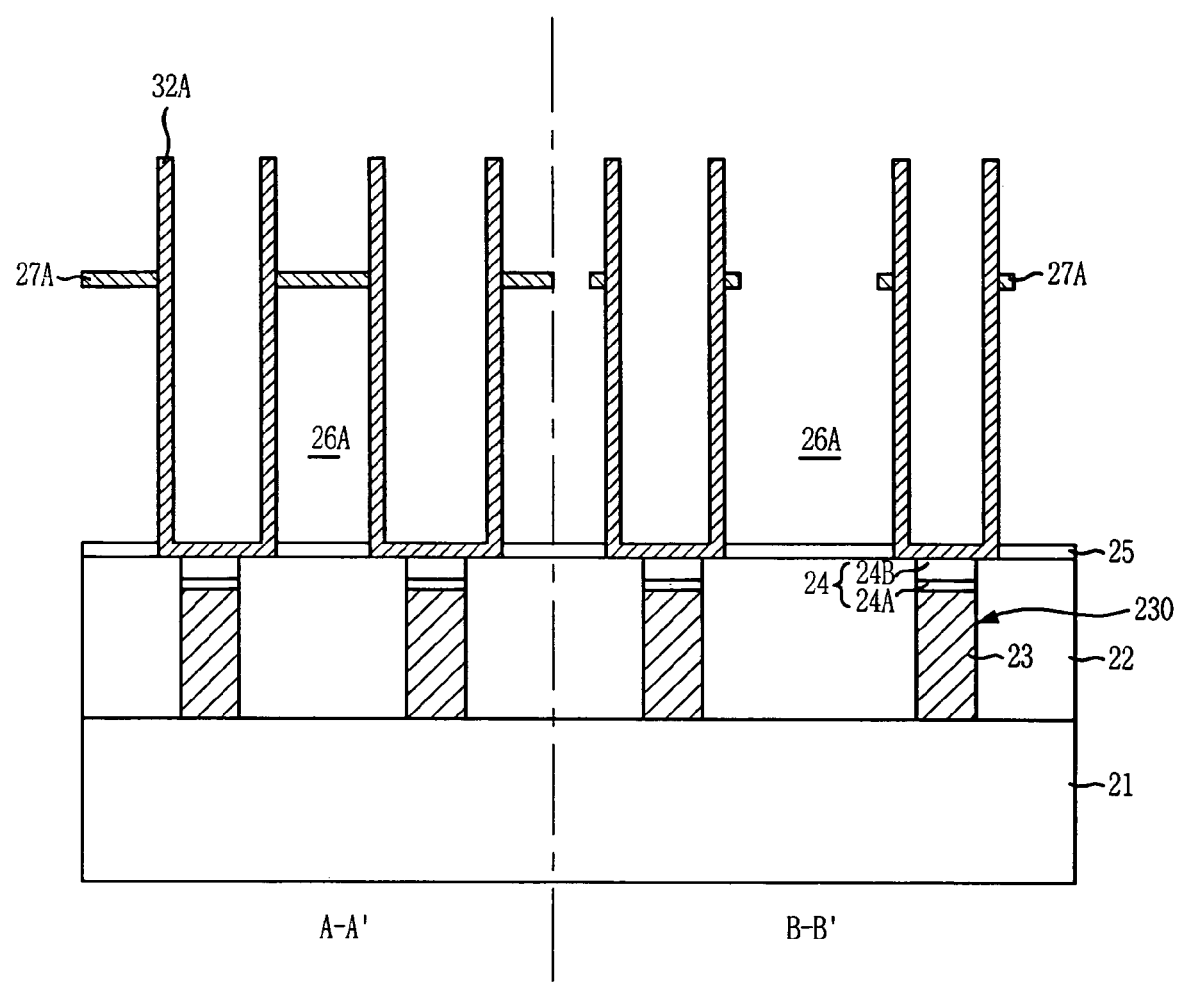

Referring to FIG. 2H, a wet dip-out treatment for an oxide material is performed. In the A-A' direction, the wet dip-out treatment removes first and second sacrificial layers 33C and 33D, patterned buffer layer 28, and patterned capacitor molding layer 26, each including an oxide-based material. In the B-B' direction, the wet dip-out treatment removes third sacrificial layer 33E, remaining buffer layer 28A, patterned sacrificial molding layer 26. In particular, the wet dip-out treatment uses an oxide etchant such as buffered oxide etchant (BOE) or hydrogen fluoride (HF) solution. Also, the wet dip-out treatment is performed for a period of time sufficient to remove first, second, and third sacrificial layers 33C, 33D, and 33E, patterned buffer layer 28, remaining buffer layer 28A, and patterned capacitor molding layer 26.

Patterned sacrificial molding layer 26 in the A-A' direction may be removed, because the oxide etchant penetrating into patterned sacrificial molding layer 26 in the B-B' direction may penetrate into patterned capacitor molding layer 26 beneath remaining interlayer 27A in the A-A' direction. Thus, empty space 26A is created when patterned capacitor molding layer 26 is removed. After the wet dip-out treatment, storage nodes 32A are formed to have a cylinder structure supported by remaining interlayer 27A.

Figure 2I:
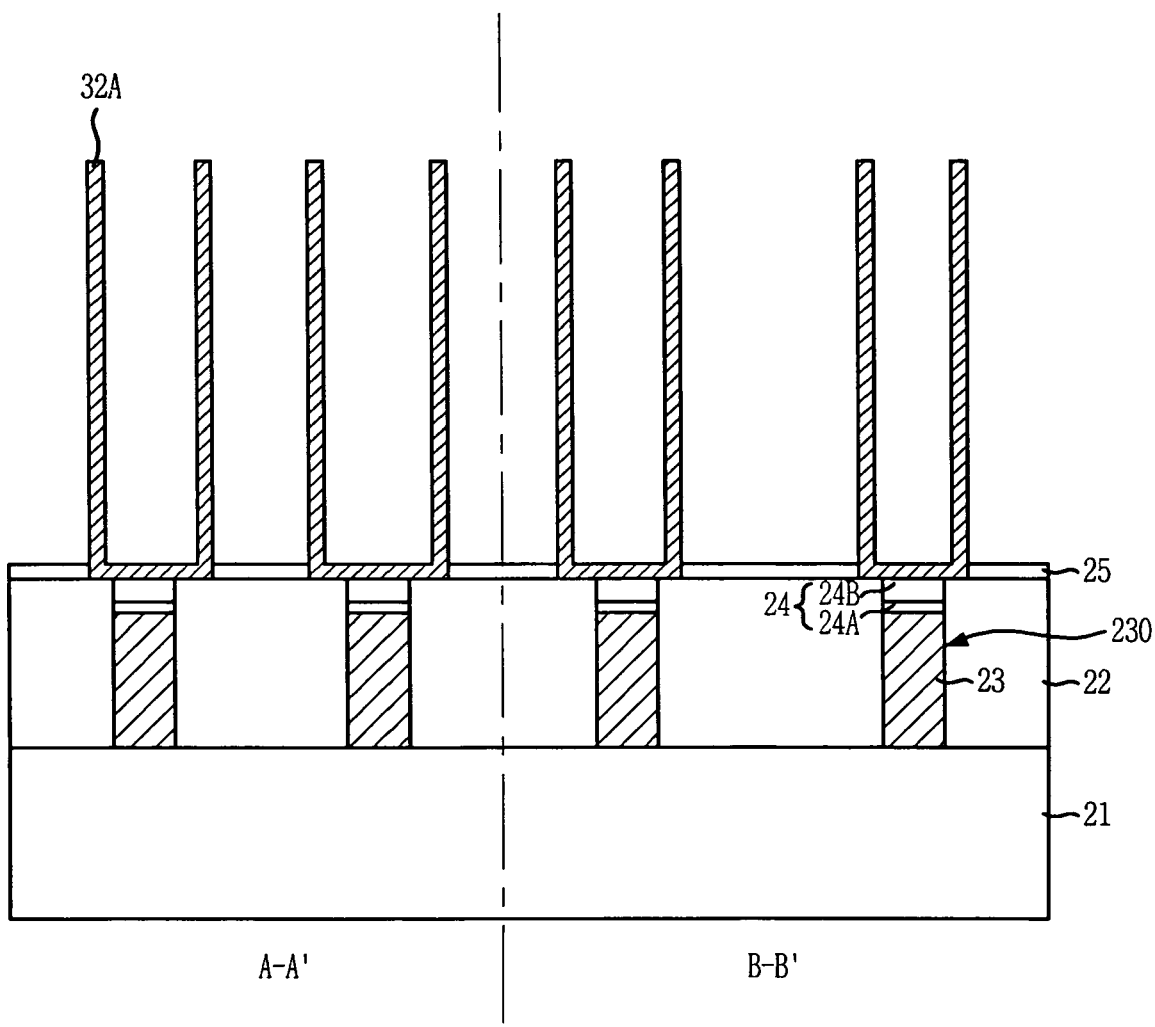

Referring to FIG. 2I, remaining interlayer 27A may be removed by performing a dry photoresist removal process. As mentioned above, remaining interlayer 27A may be easily removed by the photoresist removal method (e.g., the removal using oxygen). Although not illustrated, a dielectric layer and a top electrode may be formed above storage nodes 32A, thereby obtaining cylindrical capacitors.

Figure 3A:
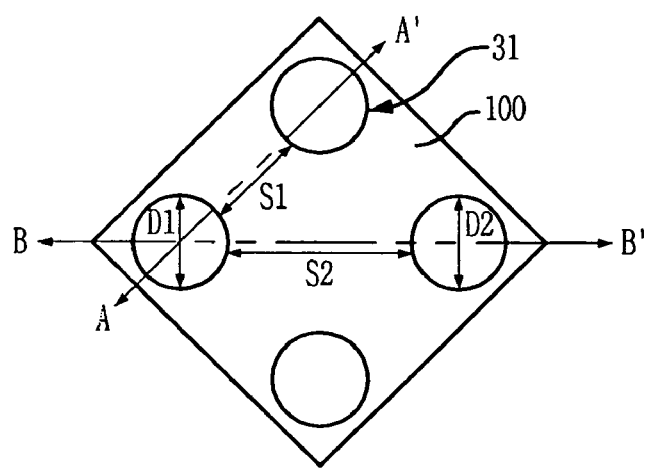
FIG. 3A illustrates a top view of opening regions consistent with an embodiment of the present invention.

FIG. 3A illustrates a top view of opening regions 31A consistent with an embodiment of the present invention. Diameters D1 and D2 of opening regions 31 may be substantially the same in the A-A' and B-B' directions. Spacing distance S1 between opening regions 31 in the A-A' direction may be greater than spacing distance S2 between opening regions 31 in the B-B' direction. Reference numeral 100 denotes first isolation structure.

Figure 3B:
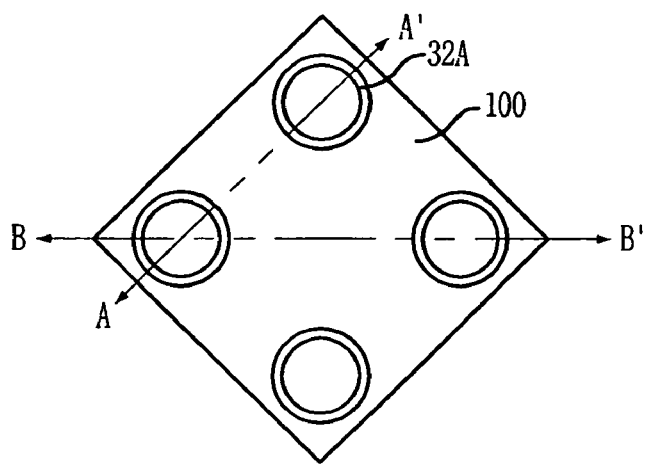
FIG. 3B illustrates a top view of a resultant structure after storage nodes are isolated from each other consistent with an embodiment of the present invention.

FIG. 3B illustrates a top view of the resultant structure obtained after the storage node isolation process consistent with an embodiment of the present invention. As shown, first isolation structure 100 supports storage nodes 32A.

Figure 3C:
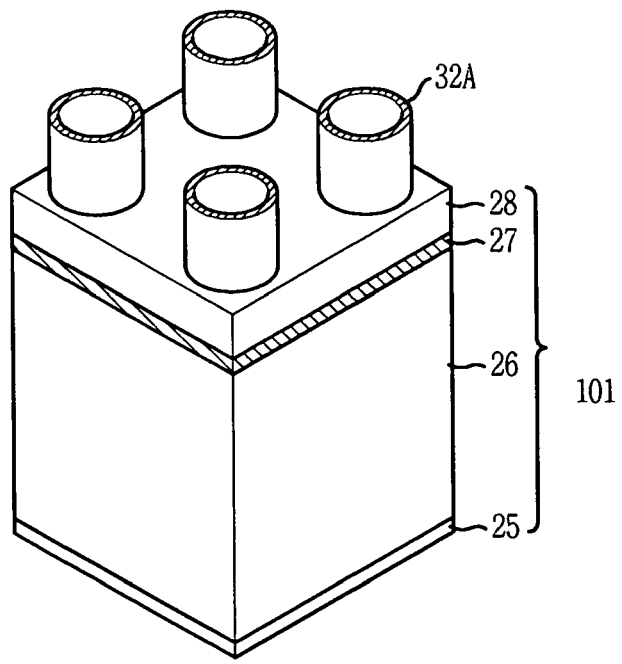
FIG. 3C illustrates a perspective view of a resultant structure after an amorphous carbon-based hard mask layer is removed consistent with an embodiment of the present invention.
Figure 3D:
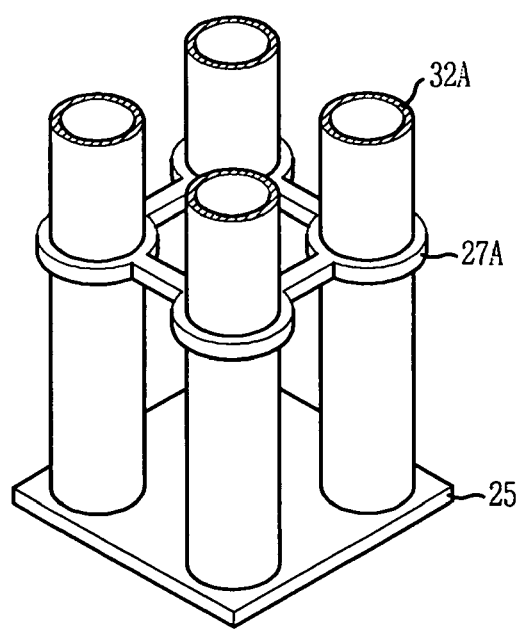
FIGS. 3D and 3E illustrate a perspective view and a top view of a resultant structure after a wet dip-out treatment is performed on an oxide-based insulation layer consistent with an embodiment of the present invention.
Figure 3E:
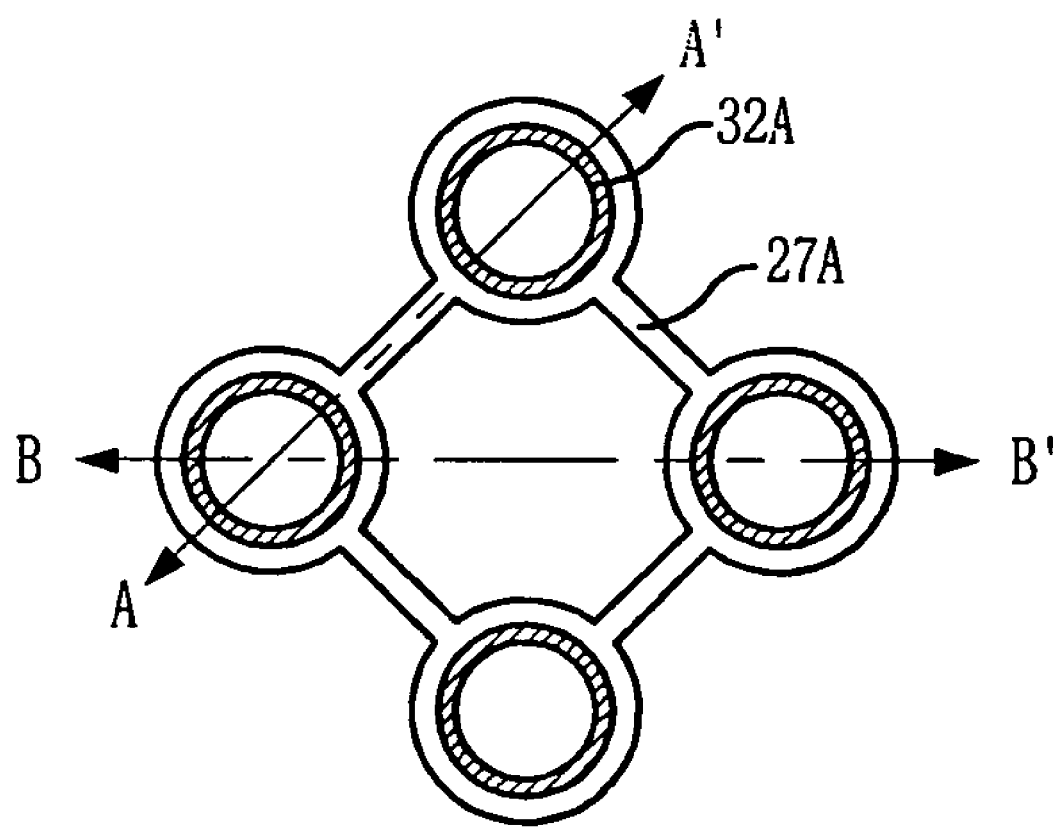

FIG. 3C illustrates a perspective view of the resultant structure after hard mask 29 is removed consistent with an embodiment of the present invention. After the removal of hard mask 29, second isolation structure 101 including patterned etch stop layer 25, patterned capacitor molding layer 26, patterned interlayer 27, and patterned buffer layer 28 remains. The top parts of storage nodes 32A above second isolation structure 101 may be exposed.

FIG. 3D illustrates a perspective view of the resultant structure after the wet dip-out treatment is performed consistent with an embodiment of the present invention. FIG. 3E illustrates a top view of the resultant structure after the wet dip-out treatment is performed consistent with an embodiment of the present invention. Remaining interlayer 27A may encompass the middle outer walls of individual storage nodes 32A like a ring. Remaining interlayer 27A in the A-A' direction and remaining interlayer 27A in a direction perpendicular to the A-A' direction may be connected together. Therefore, remaining interlayer 27A may remain in the form of connected rings around the outer walls of individual storage nodes 32A.

Thus, individual storage nodes 32A may be supported, in the A-A' direction, by the connected rings of remaining interlayer 27A, and, in the B-B' direction, by the disconnected rings of remaining interlayer 27A. Because remaining interlayer 27A in the A-A' direction and remaining interlayer 27A in the B-B' direction are connected, remaining interlayer 27A may support storage nodes 32A in all directions. Thus, storage nodes 32A supported by remaining interlayer 27A may not be bridged together even after the wet dip-out treatment described in FIG. 2H.

According to the specific embodiment consistent with the present invention, the amorphous carbon-based interlayer is inserted into the support structure for storage nodes 32A to prevent storage nodes 32A from collapsing during the wet dip-out treatment. As a result, bridges are not formed between storage nodes 32A. More specifically, the amorphous carbon-based interlayer may prevent bridges from being formed between storage nodes 32A during the wet dip-out treatment. Hence, the height of the capacitors may be increased to a great extent, thereby allowing larger capacitance.

Because the dielectric layer is formed after the amorphous carbon-based remaining interlayer is removed, the contact area of the dielectric layer with individual storage nodes 32A may be increased to allow sufficient capacitance. Furthermore, the amorphous carbon-based interlayer may be easily removed by performing a dry photoresist removal method after the cylindrical storage nodes 32A are formed. Thus, capacitors may be manufactured without decreasing the yield.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a cylindrical capacitor, the method comprising:

forming an isolation structure including an interlayer on a substrate, the substrate having a plurality of contact plugs formed therein, wherein the interlayer comprises a first amorphous carbon-based layer, and wherein forming the isolation structure includes forming a first insulation layer, the first amorphous carbon-based layer, a second insulation layer, and a second amorphous carbon-based layer over the substrate;

forming a plurality of opening regions by etching the isolation structure, thereby exposing selected portions of the contact plugs;

forming storage nodes on a surface of the opening regions;

etching selected portions of the isolation structure to form a patterned interlayer that encompasses selected portions of the storage nodes, thereby supporting the storage nodes;

removing remaining portions of the isolation structure; and removing the patterned interlayer to expose inner and outer walls of the storage nodes.

2. The method of claim 1, wherein the opening regions are formed by using a mask, the opening regions being spaced more in one direction than in another direction.

3. The method of claim 1, wherein etching the isolation structure further comprises:

forming a mask on the second amorphous carbon-based layer;

etching the second amorphous carbon-based layer using the mask to form a hard mask; and etching the second insulation layer, the first amorphous carbon-based layer, and the first insulation layer using the hard mask.

4. The method of claim 3, wherein the first and second insulation layers include an oxide-based material.

5. The method of claim 3, further comprising:

forming an etch stop layer on the substrate before forming the first insulation layer; and etching the etch stop layer after etching the second insulation layer, the first amorphous carbon-based layer, and the first insulation layer using the hard mask, thereby forming the opening regions.

6. The method of claim 5, wherein the etch stop layer includes a nitride-based material.

7. The method of claim 3, wherein the first amorphous carbon-based layer is formed to have a thickness of approximately 500 Å to 2,000 Å by performing a plasma enhanced chemical vapor deposition (PECVD) process at a temperature in a range of approximately 300° C. to 500° C.

8. The method of claim 3, wherein the second amorphous carbon-based layer is formed to have a thickness of approximately 2,000 Å to 5,000 Å by performing a plasma enhanced chemical vapor deposition (PECVD) process at a temperature in a range of approximately 300° C. to 500° C.

9. The method of claim 3, further comprising forming an additional hard mask after forming the second amorphous carbon-based layer and before forming the mask.

10. The method of claim 9, wherein the additional hard mask includes one of silicon oxynitride (SiON) and a low temperature undoped oxide-based material, and has a thickness ranging from approximately 500 Å to 1,500 Å.

11. The method of claim 3, wherein the first insulation layer includes one selected from a group consisting of plasma enhanced tetraethyl orthosilicate (PETEOS), phosphosilicate glass (PSG), and borophosphosilicate glass (BPSG), and has a thickness ranging from approximately 5,000 Å to 15,000 Å; and the second insulation layer includes one selected from a group consisting of PETEOS, PSG, and BPSG, and has a thickness ranging from approximately 2,000 Å to 5,000 Å.

12. The method of claim 3, wherein etching the isolation structure to form the patterned interlayer further comprises:
removing the second amorphous carbon-based layer of the isolation structure after forming the storage nodes;
forming a sacrificial layer over a resultant structure obtained after removing the second amorphous carbon-based layer;
selectively etching the sacrificial layer; and
etching the isolation structure up to the first amorphous carbon-based layer using the sacrificial layer as an etch mask to form the patterned interlayer encompassing the middle outer wall portions of the storage nodes as connected rings;
wherein a remaining portion of the sacrificial layer is removed simultaneously when the isolation structure except the patterned interlayer is removed.

13. The method of claim 12, wherein removing the second amorphous carbon-based layer comprises applying a plasma treatment in an atmosphere of oxygen.

14. The method of claim 12, wherein the sacrificial layer is formed to a thickness filling the space between the storage nodes that are spaced less, and not filling the space between the storage nodes that are spaced more.

15. The method of claim 14, wherein the sacrificial layer including silicon oxide ($SiO_2$), and forming the sacrificial layer comprises performing an atomic layer deposition (ALD) process.

16. The method of claim 15, wherein performing the ALD process comprises using hexachloro silane ($Si_2Cl_6$) as a source material, pyridine as a catalytic material, and water ($H_2O$) vapor as a reaction gas.

17. The method of claim 16, wherein the ALD process is performed at a temperature ranging from approximately 100° C. to 150° C.

18. The method of claim 12, wherein selectively etching the sacrificial layer and etching the isolation structure up to the first amorphous carbon-based layer using the sacrificial layer as an etch mask comprise performing a dry etch-back treatment.

19. The method of claim 1, wherein forming the storage nodes comprises:
forming a conductive layer on the upper surface of the isolation structure and the surface of the opening regions; and
removing the conductive layer formed on the upper surface of the isolation structure.

20. The method of claim 19, wherein the conductive layer includes one of titanium nitride (TiN) and ruthenium (Ru).

21. The method of claim 19, wherein removing the conductive layer comprises performing a dry etch-back treatment without using an etch barrier.

22. The method of claim 19, wherein removing the conductive layer comprises performing one of a chemical mechanical polishing (CMP) treatment and a dry etch-back treatment, both using one of a photoresist-based barrier and an oxide-based barrier.

23. The method of claim 1, wherein the isolation structure includes oxide-based materials except for the interlayer; and removing the isolation structure except for the patterned interlayer comprises performing a wet dip-out treatment.

24. The method of claim 23, wherein performing the wet dip-out treatment comprises applying a wet dip-out treatment for an oxide material by using a buffer oxide etchant (BOE) or a hydrogen fluoride (HF) solution.

25. The method of claim 1, wherein removing the patterned interlayer comprises performing a plasma treatment in an atmosphere of oxygen.

26. A method for fabricating a cylindrical capacitor, the method comprising:
forming an isolation structure over a substrate, the substrate having contact plugs formed therein, the isolation structure including an interlayer as a supporting layer, wherein the supporting layer comprises a first amorphous carbon-based layer, and wherein forming the isolation structure comprises forming a first oxide-based layer, the first amorphous carbon-based layer, a second oxide-based layer, and a second amorphous carbon-based layer over the substrate;
etching the isolation structure to form opening regions exposing the contact plugs;
forming cylindrical storage nodes in the opening regions;
removing a portion of the isolation structure to expose selected portions of the storage nodes;
etching the remaining isolation structure up to the supporting layer to form a ring-patterned supporting layer, the ring-patterned supporting layer encompassing outer walls of the storage nodes and being connected between the neighboring storage nodes;
performing a wet dip-out treatment to remove the isolation structure except for the ring-patterned supporting layer; and
removing the ring-patterned supporting layer to expose the outer and inner walls of the storage nodes.

27. The method of claim 26, wherein the second amorphous carbon-based layer is removed when the portion of the isolation structure is removed to expose the upper parts of the storage nodes.

28. The method of claim 27, wherein forming the first and second amorphous carbon-based layers comprises performing a plasma enhanced chemical vapor deposition (PECVD) method at a temperature in a range of approximately 300° C. to 500° C.

29. The method of claim 27, wherein the first and second oxide-based layers include one of plasma enhanced tetraethyl orthosilicate (PETEOS), Phosphosilicate glass (PSG), and borophosphosilicate glass (BPSG).

30. The method of claim 27, wherein removing the second amorphous carbon-based layer comprises performing a plasma treatment in an atmosphere of oxygen.

31. The method of claim 30, after removing the second amorphous carbon-based layer, further comprising:
    forming a sacrificial layer over a resultant structure after removing the second amorphous carbon-based layer;
    performing a dry etch-back treatment on the sacrificial layer such that the sacrificial layer remains in the form of spacers;
    etching the isolation structure up to the first amorphous carbon-based layer using the remaining sacrificial layer as an etch barrier to form the ring patterned supporting layer;
    wherein the sacrificial layer remaining after forming the ring patterned supporting layer is removed simultaneously when the isolation structure except for the ring patterned supporting layer is removed by the wet dip-out treatment.

32. The method of claim 31, wherein the sacrificial layer is formed to have a thickness which fills the space between the storage nodes which have a smaller space therebetween, and does not fill the space between the storage nodes which have a larger space therebetween.

33. The method of claim 32, wherein forming the sacrificial layer comprises performing an atomic layer deposition (ALD) process, the sacrificial layer including silicon oxide ($SiO_2$).

34. The method of claim 33, wherein performing the ALD process comprises using hexachloro silane ($Si_2Cl_6$) as a source material, pyridine as a catalytic material, and water ($H_2O$) vapor as a reaction gas.

35. The method of claim 34, wherein the ALD process is performed at a temperature ranging from approximately 100° C. to 150° C.

36. The method of claim 35, wherein etching the remaining isolation structure up to the supporting layer to form the ring-patterned supporting layer comprises performing a dry etch-back treatment.

\* \* \* \* \*